United States Patent
Birner et al.

(10) Patent No.: US 7,208,370 B2
(45) Date of Patent: Apr. 24, 2007

(54) METHOD FOR FABRICATING A VERTICAL TRANSISTOR IN A TRENCH, AND VERTICAL TRANSISTOR

(75) Inventors: Albert Birner, Dresden (DE); Joern Luetzen, Dresden (DE)

(73) Assignee: Infineon Technologies AG, Munich (DE)

( * ) Notice: Subject to any disclaimer, the term of this patent is extended or adjusted under 35 U.S.C. 154(b) by 338 days.

(21) Appl. No.: 10/484,562

(22) PCT Filed: Jul. 8, 2002

(86) PCT No.: PCT/EP02/07593

§ 371 (c)(1),
(2), (4) Date: Aug. 9, 2004

(87) PCT Pub. No.: WO03/010826

PCT Pub. Date: Feb. 6, 2003

(65) Prior Publication Data

US 2004/0256665 A1    Dec. 23, 2004

(30) Foreign Application Priority Data

Jul. 26, 2001  (DE)  ............................. 101 36 333

(51) Int. Cl.
*H01L 21/8242* (2006.01)
(52) U.S. Cl. .................. 438/243; 438/244; 438/386; 438/387; 257/E21.375
(58) Field of Classification Search ............. 438/245, 438/247, 248, 249, 251, 252, 388, 389, 390, 438/391
See application file for complete search history.

(56) References Cited

U.S. PATENT DOCUMENTS 5,365,097 A    11/1994  Kenney 6,093,614 A       7/2000   Gruening et al.
6,144,054 A  *  11/2000   Agahi et al. ................. 257/296
6,262,448 B1     7/2001   Enders et al.
6,500,707 B2 *  12/2002   Schrems ...................... 438/249

FOREIGN PATENT DOCUMENTS

| DE | 100 11 889 A1 | 9/2001 |
| DE | 101 13 187 C1 | 8/2002 |
| EP | 0 971 414 A1 | 1/2000 |
| WO | WO 02/073657 | 9/2002 |

\* cited by examiner

*Primary Examiner*—Michael Lebentritt
*Assistant Examiner*—Cheung Lee
(74) *Attorney, Agent, or Firm*—Morrison & Foerster LLP

(57) ABSTRACT

To fabricate a vertical transistor, a trench is provided, the side wall of which is formed by a semiconductor substrate in single crystal form and the base of which is formed by a polycrystalline semiconductor substrate. A transition region is arranged between the side wall and the base. A semiconductor layer is deposited so that an epitaxial semiconductor layer grows on the side wall and a semiconductor layer grows on the base, with a space remaining between these layers. The semiconductor layers are covered with a thin dielectric, which partially limits a flow of current, and the space is filled. During a subsequent heat treatment, dopants diffuse out of the conductive material into the epitaxial semiconductor layer, where they form a doping region. The thin dielectric limits the diffusion of the dopants into the semiconductor substrate and prevents the propagation of crystal lattice defects into the epitaxial semiconductor layer.

16 Claims, 14 Drawing Sheets

METHOD FOR FABRICATING A VERTICAL TRANSISTOR IN A TRENCH, AND VERTICAL TRANSISTOR

CLAIM FOR PRIORITY

This application claims priority to International Application No. PCT/EP02/07593, published in the German language on Feb. 6, 2003, which claims priority to German Application No. DE 101 36 333.8, filed in the German language on Jul. 26, 2001.

TECHNICAL FIELD OF THE INVENTION

The invention relates to semiconductor technology, in particular in the field of the technology used for semiconductor memories, and to a method for fabricating a vertical transistor in a trench and to a vertical transistor in a trench.

BACKGROUND OF THE INVENTION

In future generations of semiconductor products, feature sizes F (ground rules) of below 100 nm will be used. A feature size is understood as meaning the minimum resolution which can be achieved lithographically. As part of the ongoing improvement to the lithography processes which are used, it is possible to achieve ever smaller feature sizes, but these impose ever higher demands on the entire fabrication process.

The increasing reduction in feature sizes means that it is expected that in dynamic semiconductor memories (DRAMs) there will be a switch from a planar select transistor to a vertical select transistor, which may be integrated in the upper part of the trench capacitor. This change in the arrangement of storage capacitor and select transistor is caused on the one hand by the physical limits which exist for planar transistors with channel lengths of less than 100 nm. By way of example, such short channel lengths conceal the risk of increased leakage currents. Moreover, the small cross section of the channel limits the maximum level of current which can flow. On the other hand, the change to a vertical cell design is justified by the desire to achieve memory cells which are as compact as possible, i.e. have a small lateral extent. The size of memory cells is in many cases the product of F*F. A further problem which makes a change to vertical cell designs appear desirable is the formation of the connection (buried strap) between the inner electrode of the trench capacitor and the select transistor, since this connection, on account of the outdiffusion of dopants, is of a certain size and therefore entails the risk of crosstalk between adjacent memory cells.

In the case of a vertical transistor, unlike in the case of a lateral transistor, the transistor channel runs in the vertical direction with respect to the main plane of the semiconductor substrate.

Furthermore, memory cells with a vertical transistor have the fundamental advantage that in these cells the channel length of the select transistor can be set independently of the feature size F used.

Methods for fabricating a vertical transistor in a trench are described, for example, in U.S. Pat. No. 6,093,614 and U.S. Pat. No. 5,365,097. In both methods, an epitaxial semiconductor layer is deposited on a side wall of the capacitor trench in order to form the vertically running channel region. Diffusion of dopants out of the trench which has been filled with doped polysilicon results in the formation of a drain region in the epitaxial semiconductor layer. A problem found in these methods is that the outdiffusion is not spatially limited to the epitaxial semiconductor layer, but rather continues into the single-crystal semiconductor substrate and may therefore combine with outdiffusion regions of adjacent memory cells. A further drawback of the known methods is that the epitaxial semiconductor layer also grows on the polysilicon at the trench base. On account of the polycrystalline substrate material, the epitaxial semiconductor layer at that location may likewise only be polycrystalline, and consequently the epitaxial semiconductor layer is not free of crystal lattice defects. In particular, when the semiconductor layers which have been deposited on the polycrystalline substrate material and on the single-crystal semiconductor material of the side walls grow together, an epitaxial closing joint, which is characterized by an accumulation of crystal lattice defects, is formed. However, crystal lattice defects have adverse effects on the transistor properties.

SUMMARY OF THE INVENTION

The invention discloses a method for fabricating a vertical transistor in a trench in which the epitaxial semiconductor layer is virtually free of defects and the outdiffusion is spatially limited.

According to one embodiment of the invention, there is a method including:
providing a trench,
of which the base and at least one side wall consist at least in certain regions of a semiconductor material, and
which has a transition region comprising an insulating material between the regions of base and side wall which include a semiconductor material;
selectively depositing semiconductor material on those regions of the side wall and the base of the trench which consist of semiconductor material, in order to form semiconductor layers, during which step
at least the semiconductor layer which is deposited on the side wall grows as an epitaxial semiconductor layer, and
a space remains between the semiconductor layers which have been deposited on base and side wall;
forming a thin dielectric, which only partially limits an electric current, on at least one of the two semiconductor layers which have been deposited;
filling the space between the two semiconductor layers which have been deposited with a conductive material; and
forming a gate dielectric and a gate electrode on the epitaxial semiconductor layer which has grown.

According to the present invention, the epitaxial semiconductor layer neither fills the entire trench, as in U.S. Pat. No. 6,093,614, nor grows together with the polysilicon which has been deposited on the base of the trench, as in U.S. Pat. No. 5,365,097, but rather the semiconductor layers are deposited with a space being left between them. This advantageously prevents the formation of an epitaxial closing joint and of crystal lattice defects. In particular, the epitaxial semiconductor layer which grows onto the side wall is free of defects, so that a perfect transistor channel can form at that location. In order also to suppress the formation of crystal lattice defects during subsequent steps, in which the space is filled with a conductive material, a thin dielectric, which only partially limits an electric current, is formed at least on the epitaxial semiconductor layer. This fulfills two functions. Firstly, the epitaxial semiconductor layer which has grown on the side wall is isolated from semiconductor layers which are not in single crystal form, so that crystal lattice defects cannot spread to the epitaxial semiconductor layer. The thin dielectric therefore fulfills the function of a matching or buffer layer between the deposited conductive material and the epitaxial semiconductor layer. Secondly, the thin dielectric limits the diffusion of dopants out of the conductive material into the epitaxial semiconductor layer and into the adjacent single-crystal semiconductor substrate. The doping region which is formed in the process is therefore more compact and does not extend as far into the single-crystal semiconductor substrate. The risk of doping regions of adjacent transistors overlapping one another is considerably reduced. Therefore, the trenches in which the vertical transistors are formed can also be arranged spatially closer together. A further advantage of the vertical transistor which has been fabricated in this way includes the freedom of choice with regard to the setting of the channel cross section and the channel length. The channel length is substantially predetermined by the length of the epitaxial layer. By contrast, the cross section of the channel is predetermined by the thickness of this layer.

The deposition of the semiconductor layers preferably takes place selectively with respect to the material of the transition region, so that the semiconductor layers grow on the substrate of semiconductor material. The selectivity also leads to semiconductor layers of better quality.

To enable the thin dielectric to reduce a flow of electric current to an acceptable extent, it is preferably limited to 2 to 3 monolayers. The thickness may in this case be approximately 5 Å. The contact resistance which is determined by the thin dielectric should be in the region of 1 Kohm. On account of the relatively large area between epitaxial semiconductor region and deposited semiconductor material, the resistance caused by the thin dielectric does not have such major consequences. The dielectric is preferably produced using a self-retarding process. An example of such a process is the nitriding of silicon in an ammonia-containing atmosphere at approximately 700° C. for approx. 10 min.

The thin dielectric preferably comprises silicon nitride, and the deposited semiconductor layers preferably comprise silicon, the thin dielectric being produced by thermal nitriding of the semiconductor layers.

In an advantageous embodiment of the method according to the invention, the side walls of the trench are formed by a semiconductor substrate in single crystal form, and the semiconductor material which forms the base of the trench is formed by polycrystalline semiconductor material. In this case, it is preferable if the polycrystalline semiconductor material is of the first conductivity type and the semiconductor substrate in single crystal form is of the second conductivity type. The semiconductor layers which have been deposited preferably adopt the doping of the substrate on which they have been formed. By way of example, it is advantageous if the semiconductor material which has been deposited selectively on the side wall and the base has the conductivity type of the single-crystal semiconductor material of the side wall. In a subsequent doping step, for example by means of an implantation, the doping of the semiconductor material which has been deposited on the base is reversed, in order to set the conductivity type of the polycrystalline semiconductor material at the base.

Since the crystallinity of the deposited semiconductor layers is dependent, inter alia, on the crystallinity of the substrates on which they have been deposited, the semiconductor layer which has been deposited at the base of the trench grows in polycrystalline form. Furthermore, it is expedient if the epitaxial semiconductor layer is doped in situ while it is being formed. The extent of the doping can be changed during the deposition. If the cross section of the trench is assumed to be circular or elliptical, it is possible to produce regions of identical or different dopant concentration, running in the shape of a circle or concentrically, in order to optimally set the properties of the transistor channel. A broad channel cross section with a homogeneous characteristic, if appropriate with an increased dopant concentration toward the gate dielectric, is advantageous.

The cross section of the trench which runs horizontally with respect to the substrate surface is typically elliptical. In this case, the more strongly curved regions may be cut off by insulation regions which have been introduced into the semiconductor substrate. In this case, the epitaxial semiconductor region comprises two half-shells which lie opposite one another.

The thin dielectric should at least delimit the epitaxial semiconductor layer with respect to the conductive material. Alternatively, the thin dielectric may additionally be provided on the semiconductor layer which has been deposited at the base of the trench.

One possible way of producing the thin dielectric on the epitaxial semiconductor layer includes the method in which
the thin dielectric is formed on both deposited semiconductor layers, and
before the space is filled with the conductive material, an insulating layer is deposited using an anisotropic deposition process and is then etched isotropically, so that the insulating layer is removed from vertical surfaces and substantially remains at the base of the trench.
In this case, it is preferred if
to fill the space with the conductive material, first of all the entire trench is substantially filled with the conductive material,
a mask is formed in the region of the trench opening, above the epitaxial semiconductor layer which has been applied to the side wall,
an anisotropic etch is carried out using the mask, during which etch the conductive material is removed from the trench down as far as the space and, at the same time, a surface of the epitaxial semiconductor layer which faces toward the interior of the trench is uncovered; and
the gate dielectric is formed on the uncovered surface of the epitaxial semiconductor layer.
Furthermore, it has proven advantageous if
the anisotropic etching stops at the insulating layer which has remained at the base of the trench,
the insulating layer and the thin dielectric are then removed from the base of the trench, and
the cavity which has formed in this way between the conductive material and the semiconductor layer which has been deposited at the base of the trench is filled with a further conductive material.

The further conductive material should preferably be polysilicon or tungsten silicide. In this case, the polysilicon may be of the first conductivity type and may be highly doped.

To form a doping region of the first conductivity type in the epitaxial semiconductor layer, a heat treatment is carried out, in which dopants diffuse out of the conductive material and if appropriate out of the polycrystalline semiconductor material located or deposited at the base into the epitaxial semiconductor layer through the thin dielectric which has been formed on the epitaxial semiconductor layer. The heat treatment may, for example, be carried out at 1050° C. for 1 min. It is favorable if this can take place as part of a heat treatment which is already required for other purposes. In this context, by way of example, an oxidation step which is used to provide the side walls of isolation trenches which have been etched into the semiconductor substrate with an approximately 10 nm thick oxide layer before the actual filling with an insulating material is recommended. Another process is likewise an oxidation process, in which passivation of semiconductor substrate surfaces which are not used as active regions takes place.

It is particularly preferable if the trench is an upper part of a capacitor trench, and the semiconductor material located at the base of the trench is formed by the polycrystalline semiconductor material of the inner capacitor electrode of the trench capacitor. In this case, a vertical select transistor, which does not require any additional planar space, is fabricated in the upper part of the capacitor trench. The vertical transistor is completely integrated in the capacitor trench.

It has proven to be a particular advantage that the trench can have a cross section whose extent is greater than the minimum feature size which can be achieved by lithography and is used, for example, for the fabrication of lateral transistors. Compared to a laterally formed transistor, a vertical transistor does not require any additional lateral space. Therefore, the individual capacitor trenches can be arranged closer together. The minimum lateral distance between two capacitor trenches (measured from the trench wall of one capacitor trench to the trench wall of the adjacent capacitor trench), however, is determined by the size of the outdiffusion regions (buried straps) which are formed to make contact between the inner capacitor electrodes and the drain regions of the select transistors. In this context, the invention makes it possible to reduce this distance further, since the extent of the outdiffusion regions is limited on account of the thin dielectric and these regions do not extend as far into the semiconductor substrate. The outdiffusion region may preferably also be formed behind a protective cladding, in order to limit the outdiffusion region substantially to the epitaxial semiconductor layer. By way of example, the insulation collar of the trench capacitor represents a protective cladding of this type. The reduction in the minimum lateral distance which is made possible by the method according to the invention on the other hand makes it possible to increase the size of the cross section of the trenches while retaining a constant packing density of the capacitor trenches. The increase in the diameter leads to a range of process technology advantages for the fabrication of the trench capacitor. In particular, all the etching, patterning and deposition steps in the capacitor trench can be carried out more easily on account of the increased space available. Examples of these steps are the etching of the capacitor trench itself, the formation of the insulation collar in the upper part of the capacitor trench, the formation of the storage dielectric and the deposition of the filler material in order to form the inner capacitor electrode. Furthermore, the larger cross section of the capacitor trench also leads to a reduced series resistance of the inner capacitor electrode. It is also easier to carry out measures which increase the surface area in the capacitor trench in order to increase the storage capacitance; in this context, hemispherical silicon grains (HSG) or wavy trenches could be mentioned.

In another embodiment of the invention, there is a method for fabricating a vertical transistor in a trench, including:

forming a trench in a single-crystal semiconductor material of the second conductivity type, which apart from its upper part is lined with a dielectric and which is filled with a doped polycrystalline semiconductor material of the first conductivity type, so that an upper partial trench remains, extending above the polycrystalline semiconductor material, a transition region comprising insulating material, which runs approximately in the shape of a ring at the base of the partial trench, being arranged between the polycrystalline semiconductor material located at the base of the partial trench and the single-crystal semiconductor material which forms the side walls of the partial trench;

selectively depositing semiconductor material on side wall and base of the partial trench, in order to form semiconductor layers, during which step
the semiconductor layer which has been deposited on the side wall grows as an epitaxial semiconductor layer, and
the semiconductor layer which has been deposited on the base grows as a polycrystalline semiconductor layer, and
a space remains between the two semiconductor layers which have been deposited;

forming a thin dielectric, which partially limits an electric current, on the epitaxial semiconductor layer;

filling the space between the two semiconductor layers which have been deposited with a doped polycrystalline semiconductor material of the first conductivity type;

forming a gate dielectric and a gate electrode on the epitaxial semiconductor layer; and carrying out a heat treatment, as a result of which dopants of the first conductivity type diffuse out of the polycrystalline semiconductor material which has been deposited, through the thin dielectric, into the epitaxial semiconductor layer where they form a doping region of the first conductivity type.

Furthermore, in one aspect of the invention, a vertical transistor is provided in a trench which has at least one side wall and a base, the channel region of the vertical transistor being formed in an epitaxial semiconductor layer which has been deposited on the side wall, and the epitaxial semiconductor layer being connected in an electrically conductive manner to a semiconductor material which forms the base of the trench, the intention being that the vertical transistor should have a substantially defect-free channel region and a smaller outdiffusion region. A vertical transistor is described, for example, in the abovementioned U.S. Pat. No. 5,365,097.

In the abovementioned vertical transistor, a thin dielectric, which partially limits an electric current, is arranged between the epitaxial semiconductor layer and the electrically conductive material.

The side wall of the trench preferably forms a continuous surface all the way around, along which the epitaxial semiconductor layer is formed in the form of two half-shells which lie opposite one another.

The vertical transistor, in one embodiment, is preferably part of a semiconductor product having at least one memory cell, which includes
a trench, which is formed in a semiconductor substrate and has an upper and a lower section,
a storage dielectric which lines at least the lower section of the trench,
a capacitor electrode arranged in the lower section of the trench, the other capacitor electrode being formed by the semiconductor substrate, and
the vertical transistor formed in the upper section of the trench, the side wall being formed by the semiconductor substrate, and the base being formed by the capacitor electrode arranged in the lower section.

BRIEF DESCRIPTION OF THE DRAWINGS

In the text which follows, the invention is explained with reference to the exemplary embodiments and illustrated in the figures, in which:

FIGS. 2-1 to 2-11 show a second embodiment of the method according to the invention.

FIG. 3 shows a plan view of a trench with a vertical transistor.

DETAILED DESCRIPTION OF THE INVENTION

FIGS. 1-14 and 2-11 show embodiments of the vertical transistor according to the invention and of the memory cell.

Figure 1:
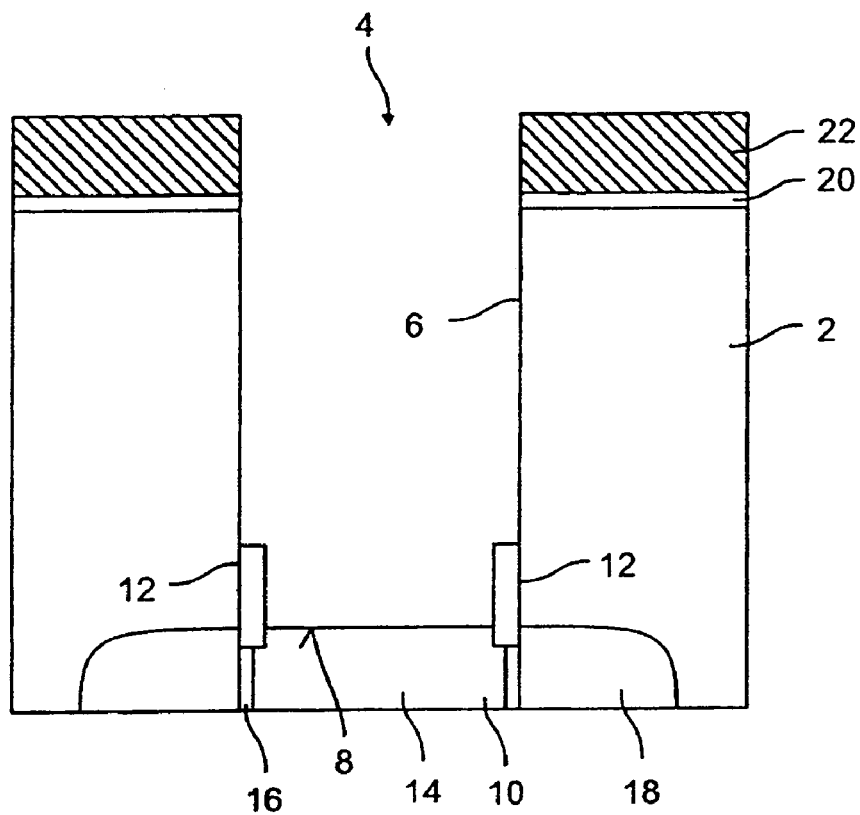
FIGS. 1-1 to 1-14 show a first embodiment of the method according to the invention.

The starting point for the explanation of the invention is a structure as shown in FIG. 1-1. In a p-doped semiconductor substrate 2 in single crystal form, preferably comprising silicon, there is a trench 4, the side walls 6 of which are formed by the single-crystal semiconductor substrate 2. At the base 8 of the trench 4 there is a polycrystalline semiconductor material 10, preferably n-doped polysilicon. Furthermore, the edge region of the base 8 has a transition region 12, including an insulating material, which isolates the base 8 from the side walls 6. In the case of a capacitor trench of a memory cell, the transition region 12 is formed by the insulation collar of the trench capacitor. The trench 4 is an upper partial trench of a capacitor trench which extends further into the depth of the semiconductor substrate 2. In FIG. 1-1, the inner capacitor electrode 14, which is formed by the n-doped polysilicon, of the trench capacitor which is partly formed in the capacitor trench can be seen. To some extent, it is also possible to make out the storage dielectric 16 and the outer capacitor electrode 18 which is formed by the semiconductor substrate 2, which is n-doped at that location.

At its upper edge, the single-crystal semiconductor substrate, 2 is covered by an approximately 8 nm thick pad oxide 20 and an approximately 200 nm thick pad nitride 22. The uncovered trench 4 extends from the base 8 to the upper edge of the semiconductor substrate 2, over an extent of approximately 250 to 500 nm. Any storage dielectric which may have been present on the side walls 6 of the trench 4 has been removed in advance. The storage dielectric 16 preferably consists of oxynitride or a double-layer system comprising silicon oxide and silicon nitride, and can therefore be removed to a substantial extent selectively with respect to the material of the insulation collar 12, which may, for example, be silicon nitride. If the storage dielectric 6 consists partly of silicon nitride, although removal of this dielectric involves removal of a certain proportion of the insulation collar 12, a negligible amount of the insulation collar is removed since the insulation collar is considerably thicker (approximately 5–6 times thicker) than the storage dielectric.

Figures 1, 2:
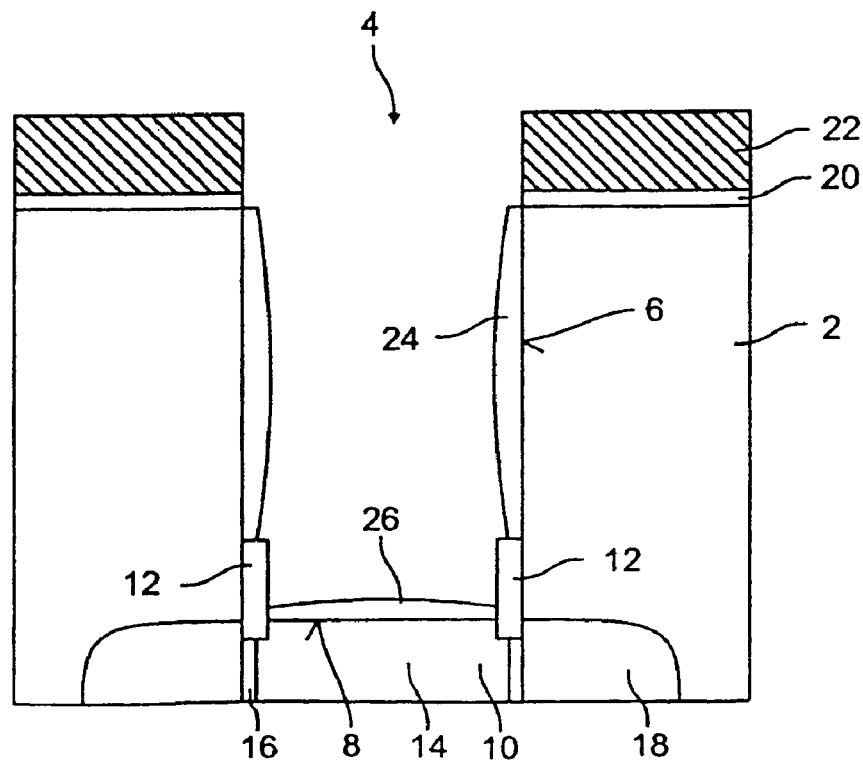
Figures 1, 2, 3:
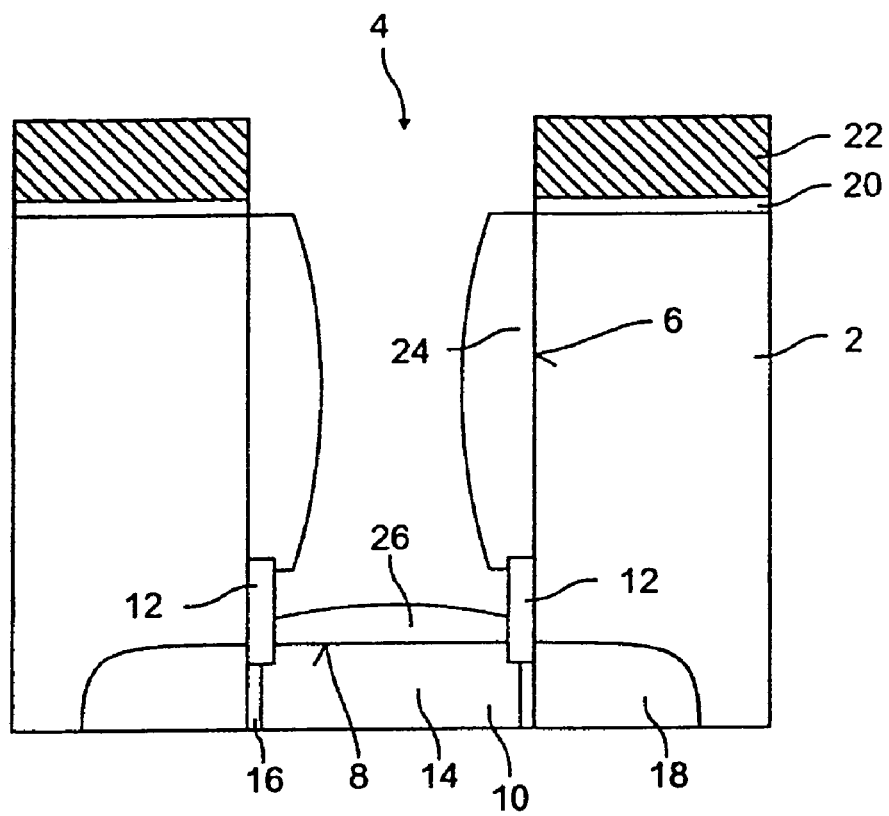
Figures 1, 2, 3, 4:
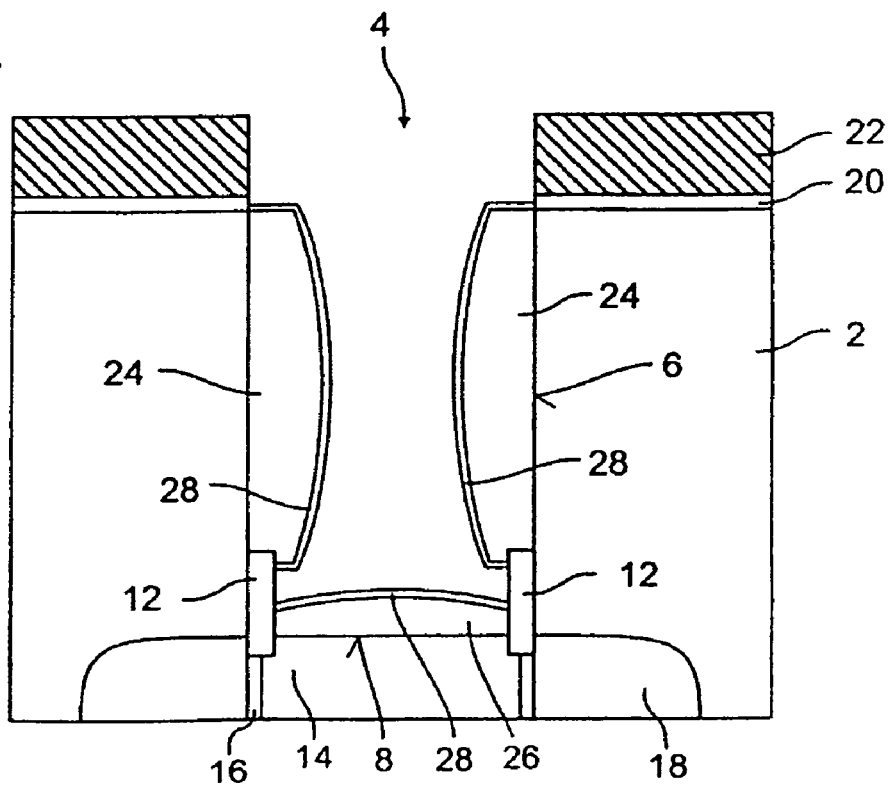
Figures 1, 2, 3, 4, 5:
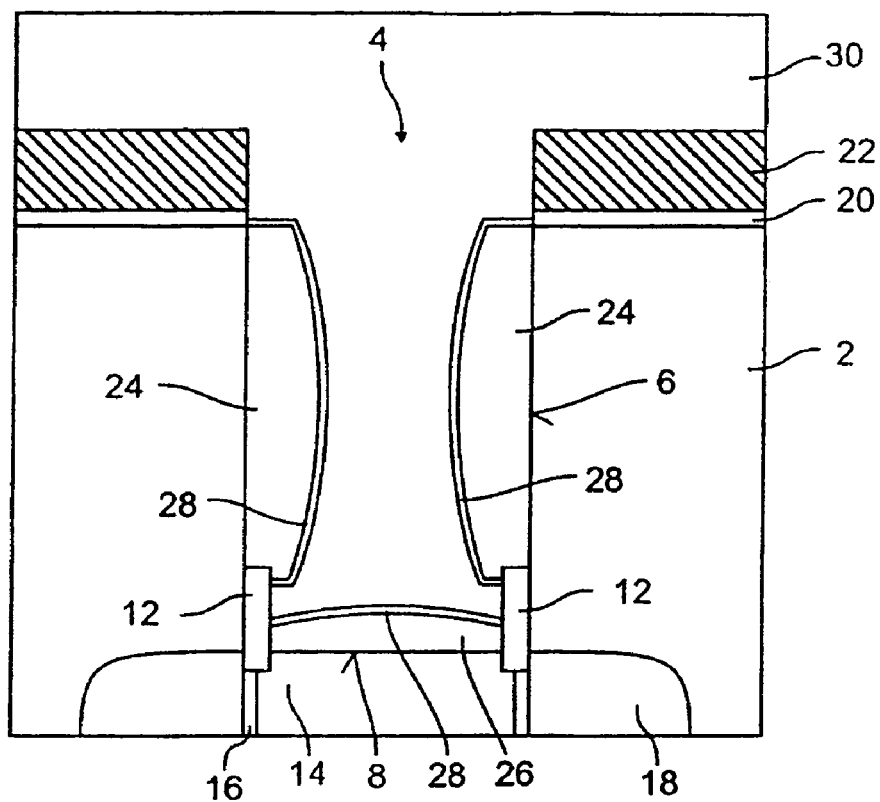
Figures 1, 2, 3, 4, 5, 6:
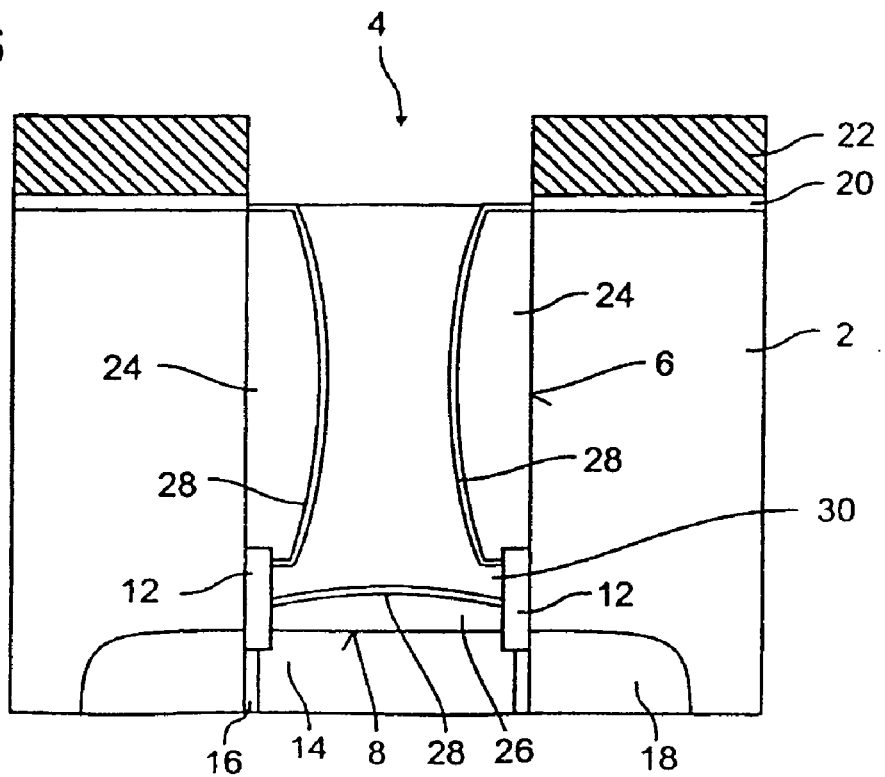
Figures 1, 2, 3, 4, 5, 6, 7:
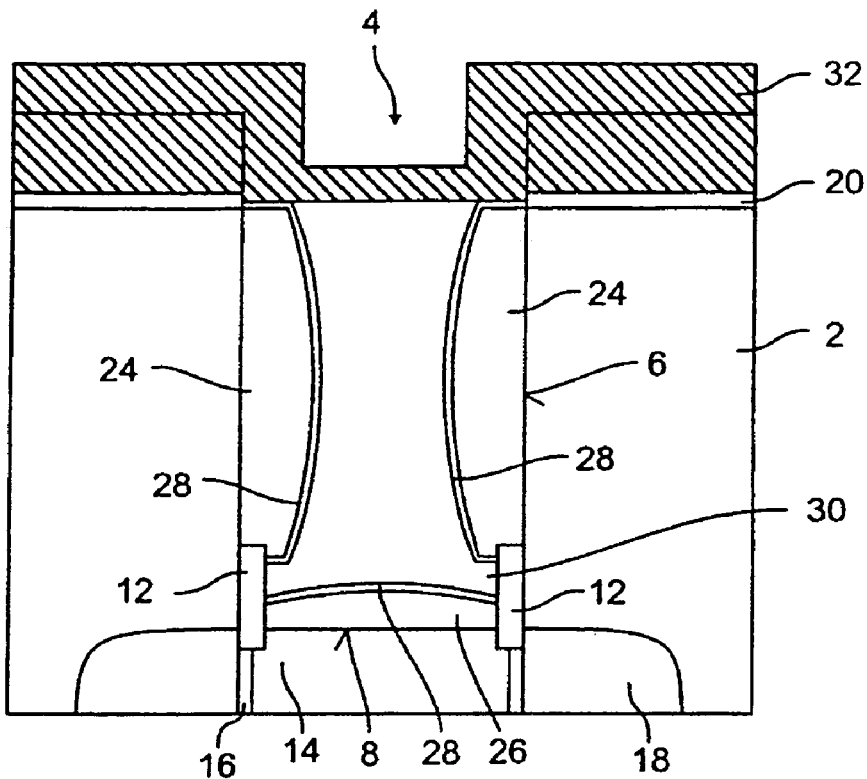
Figures 1, 2, 3, 4, 5, 6, 7, 8:
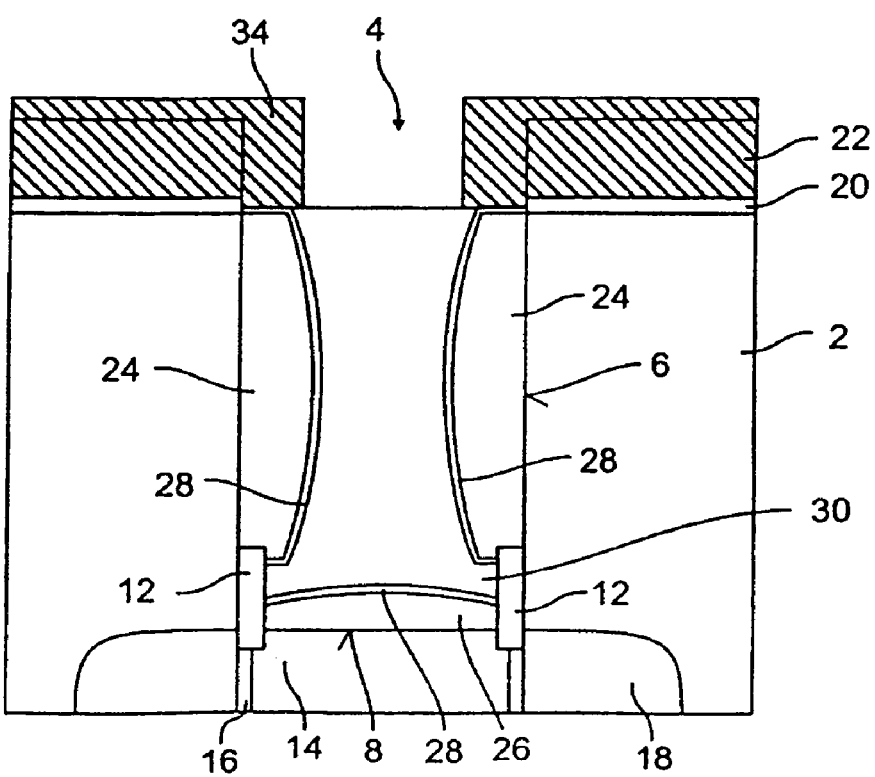
Figures 1, 2, 3, 4, 5, 6, 7, 8, 9:
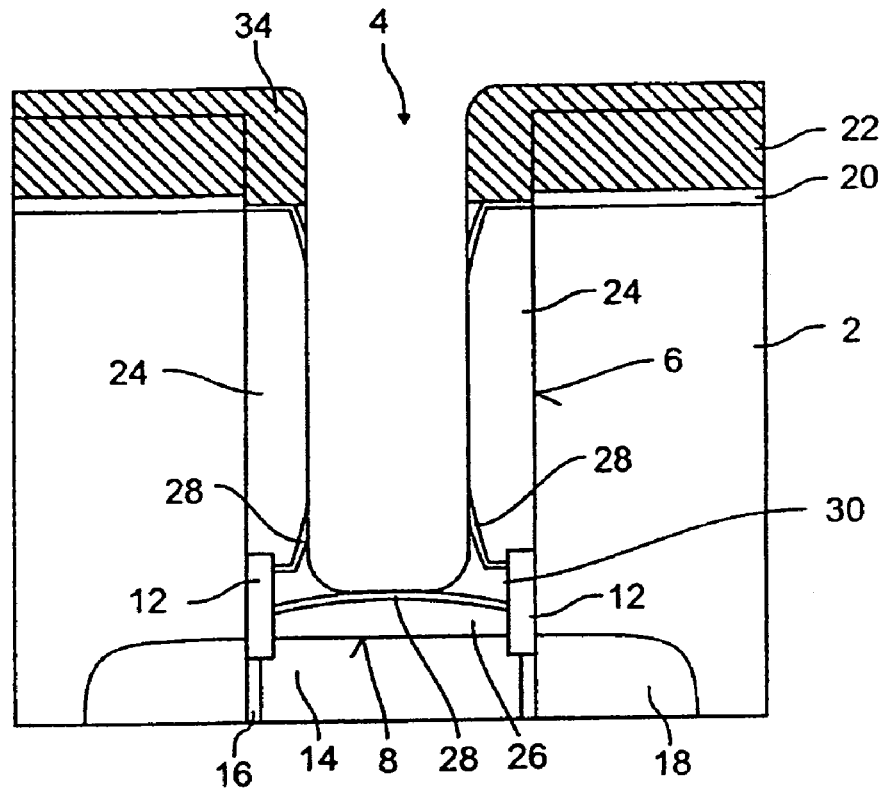
Figures 1, 2, 3, 4, 5, 6, 7, 8, 9, 10:
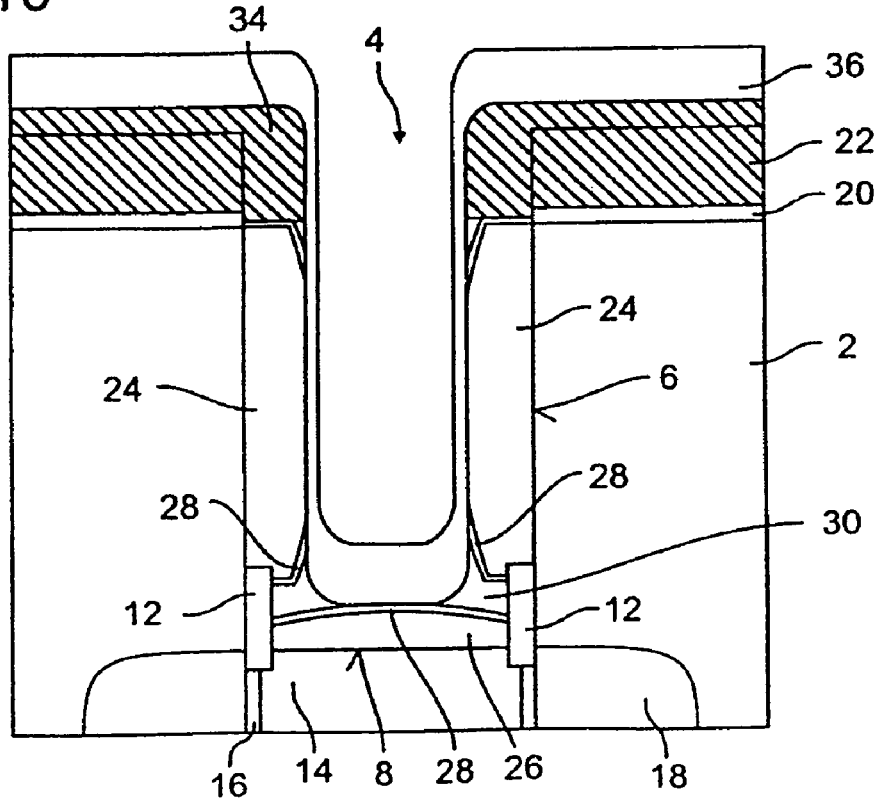
Figures 1, 2, 3, 4, 5, 6, 7, 8, 9, 10, 11:
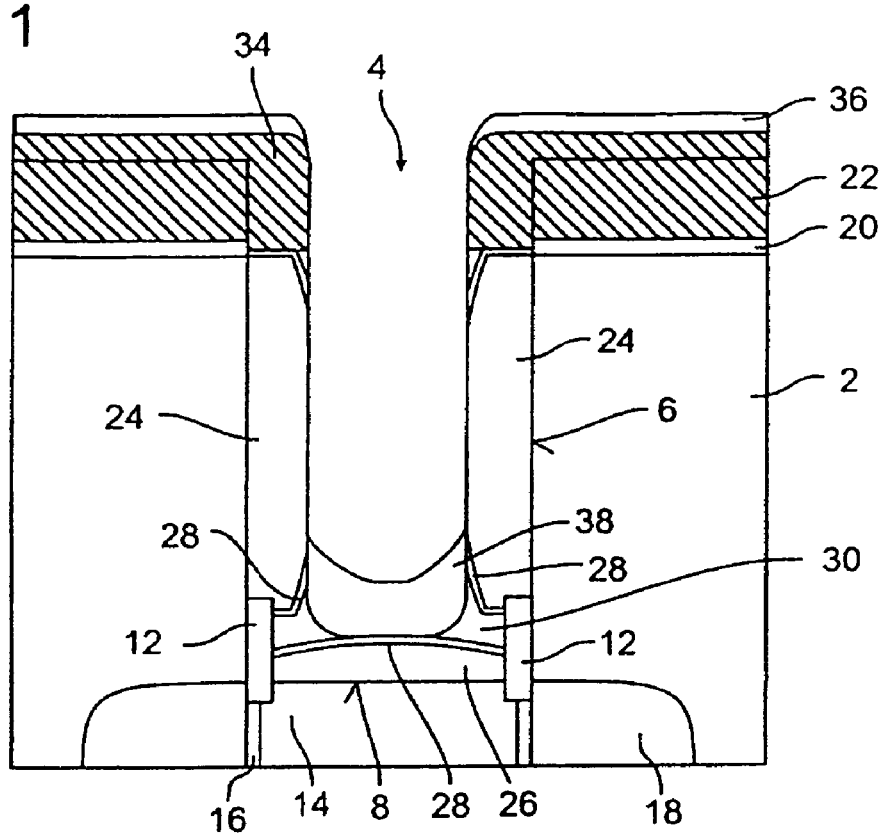
Figures 1, 2, 3, 4, 5, 6, 7, 8, 9, 10, 11, 12:
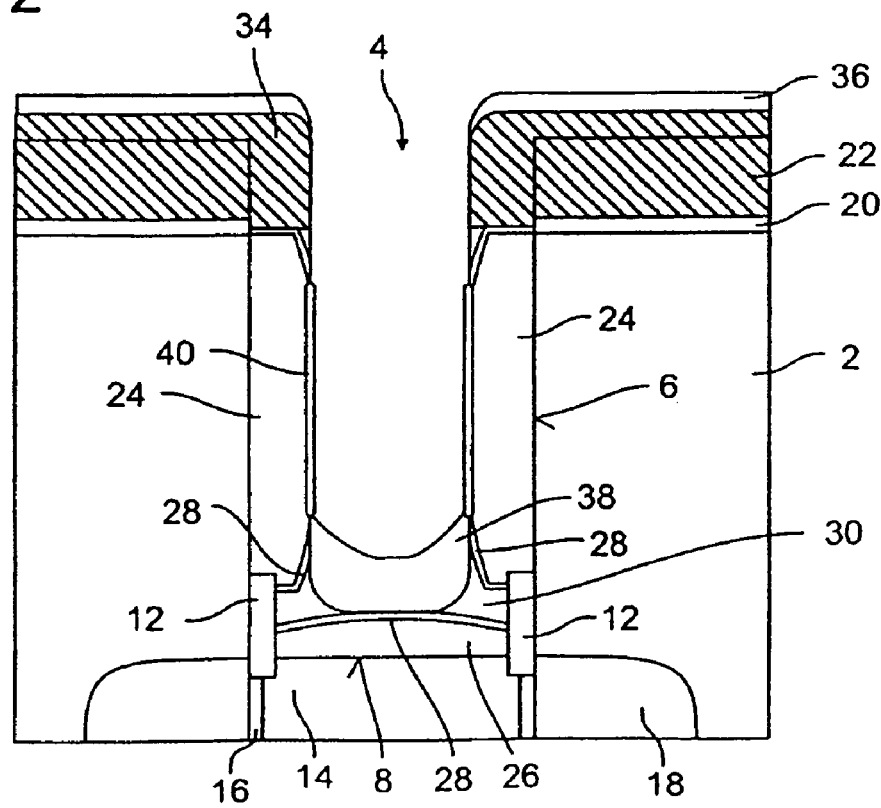
Figures 1, 2, 3, 4, 5, 6, 7, 8, 9, 10, 11, 12, 13:
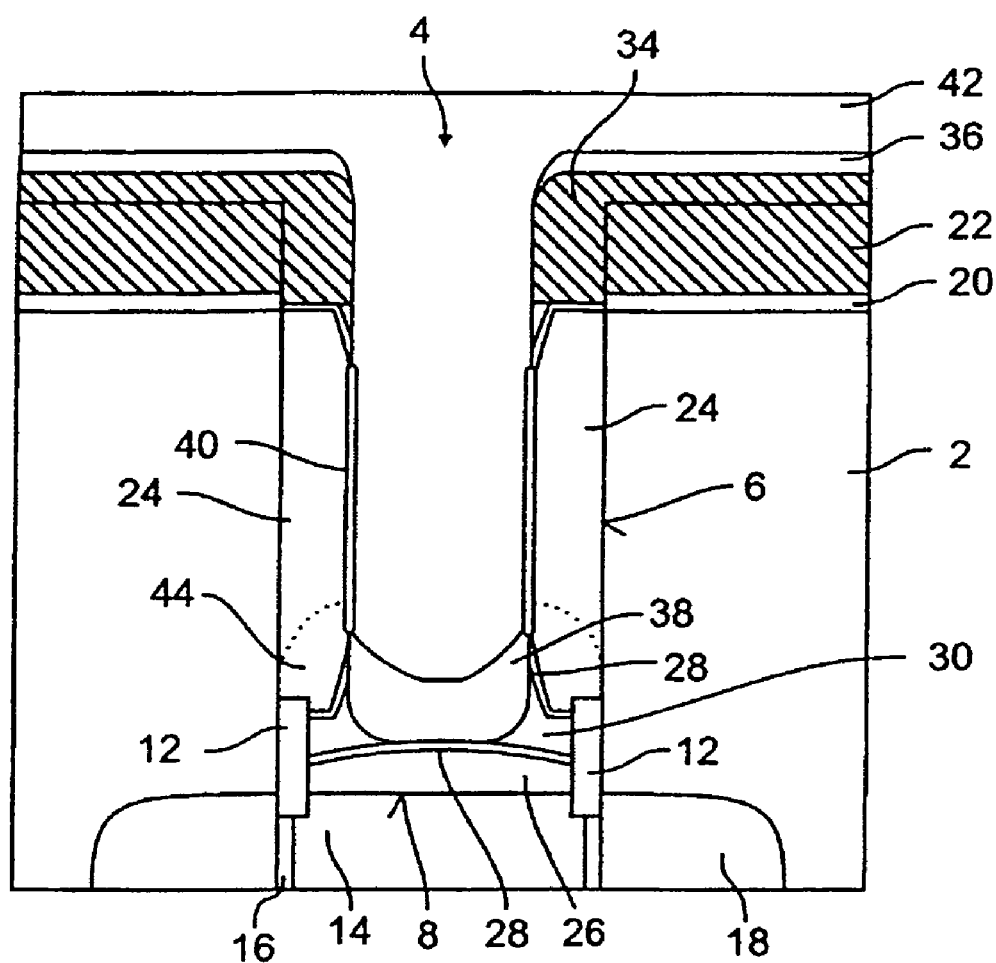
Figures 1, 2, 3, 4, 5, 6, 7, 8, 9, 10, 11, 12, 13, 14:
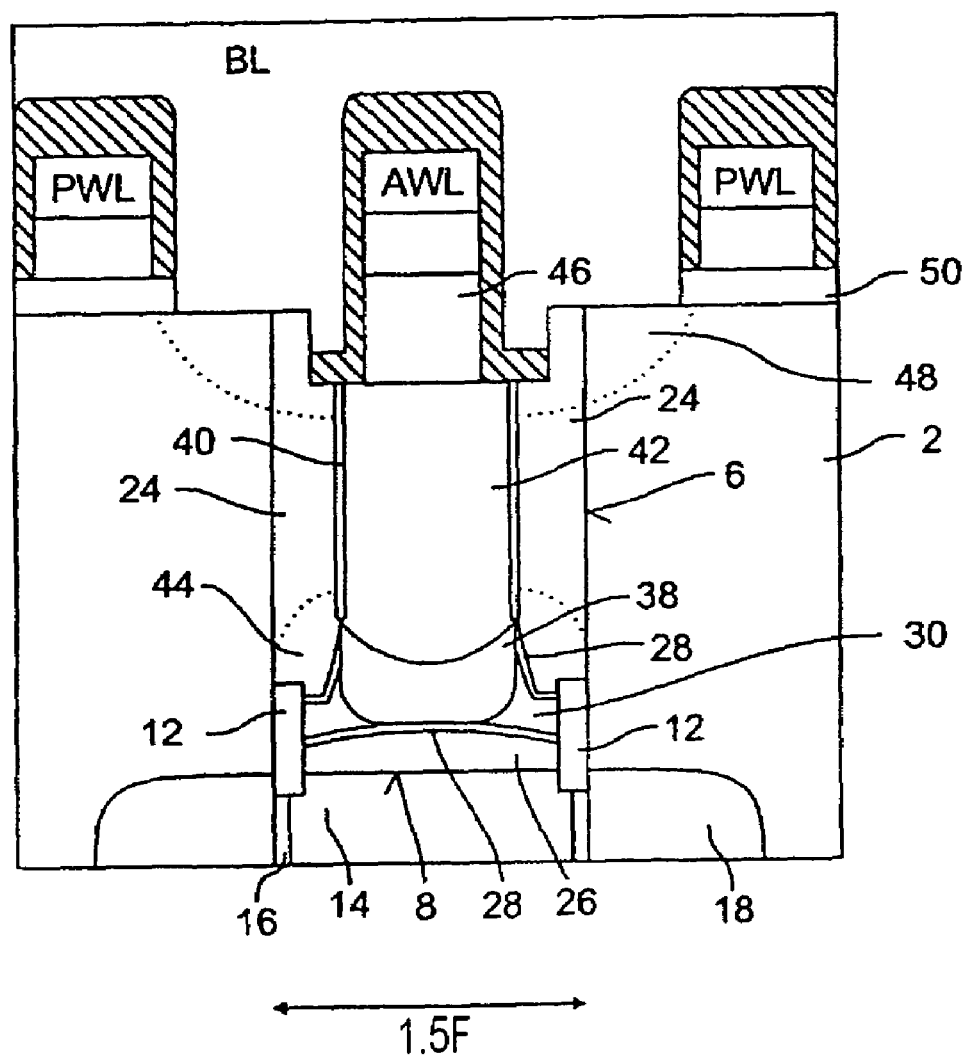
Figures 1, 2:
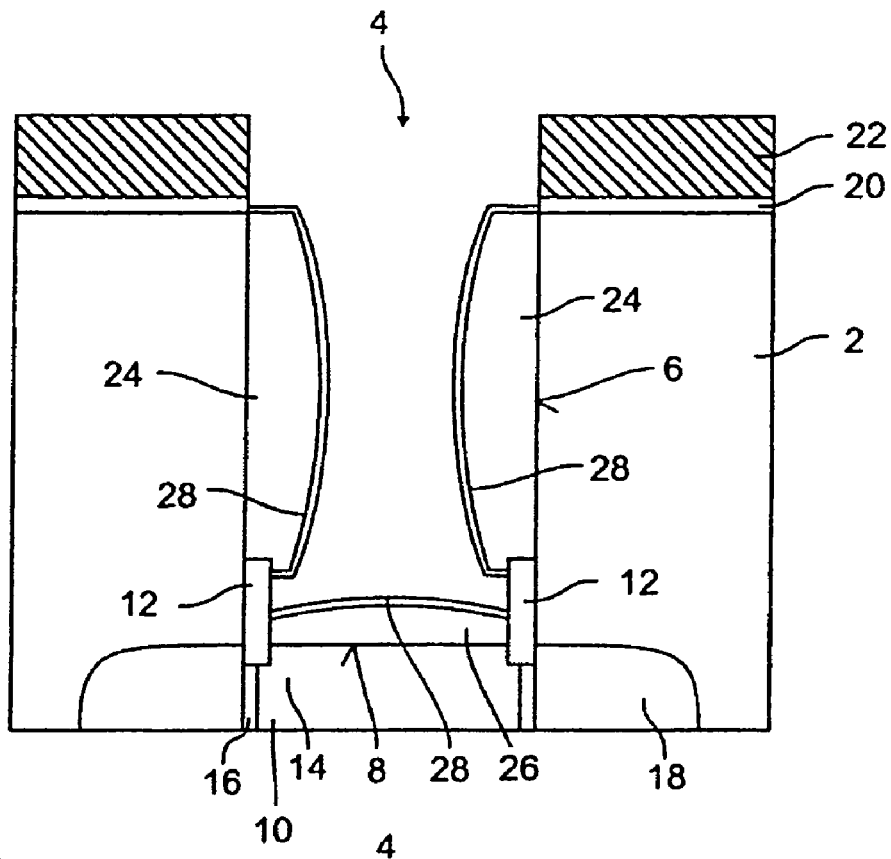
Figure 2:
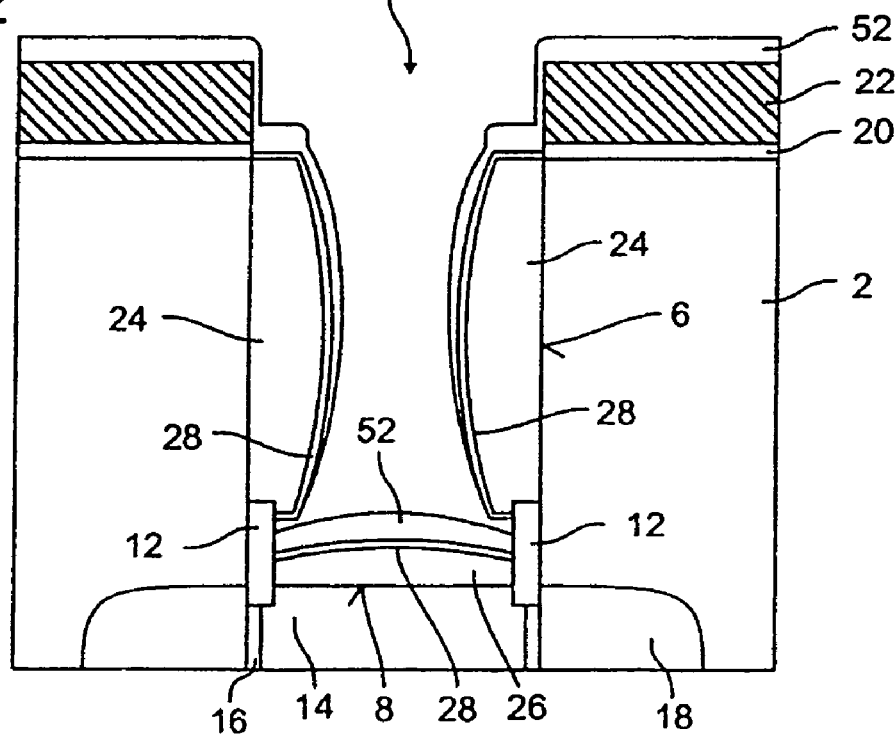
Figures 2, 3:
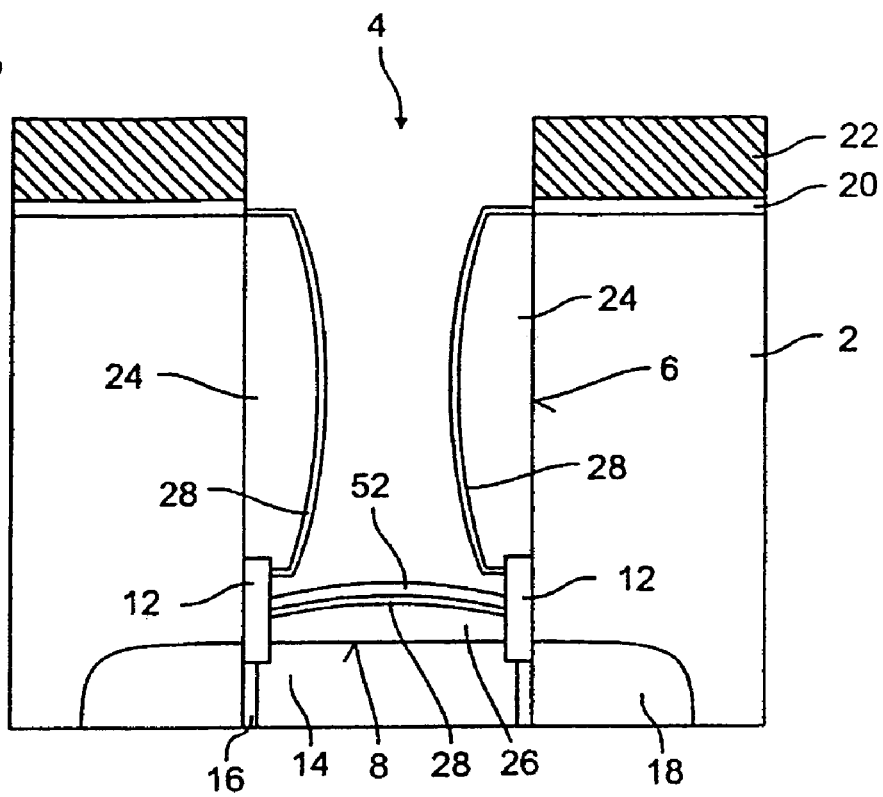
Figures 2, 3, 4:
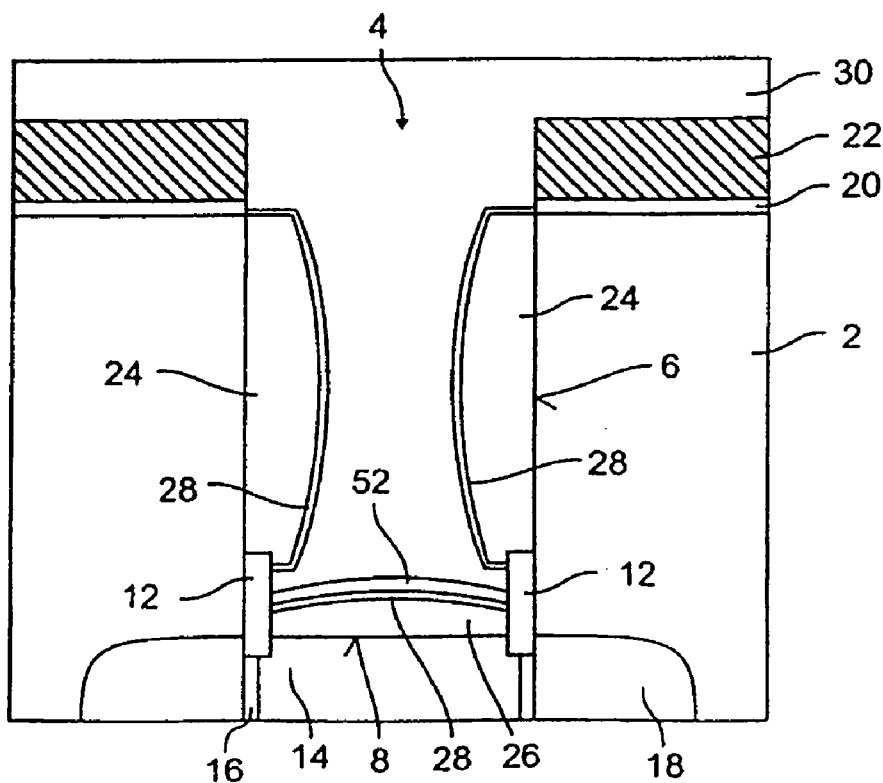
Figures 2, 3, 4, 5:
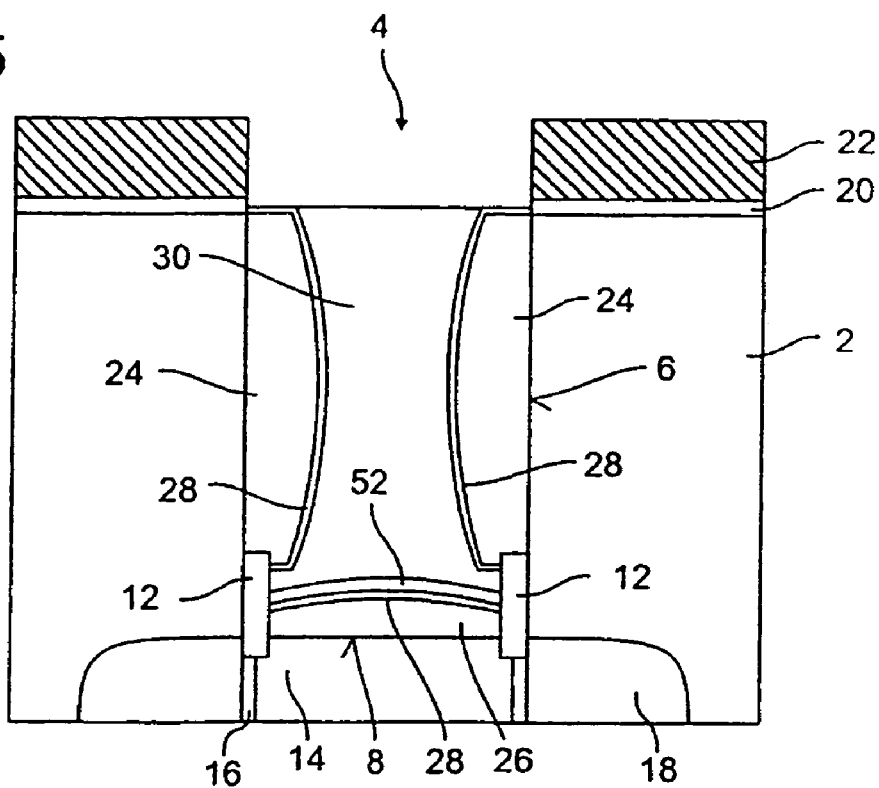
Figures 2, 3, 4, 5, 6:
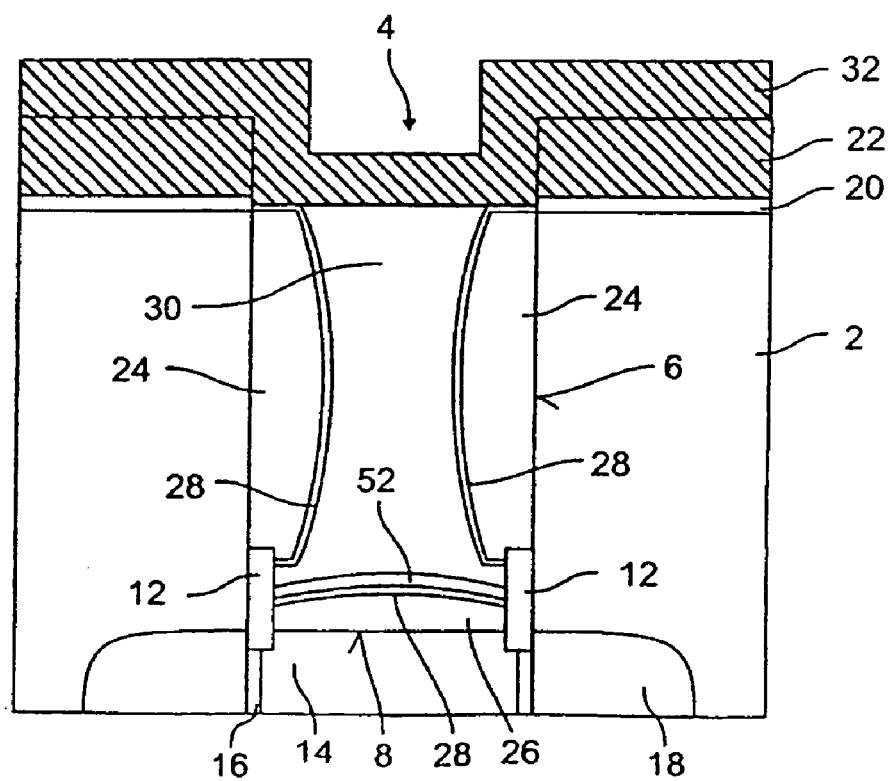
Figures 2, 3, 4, 5, 6, 7:
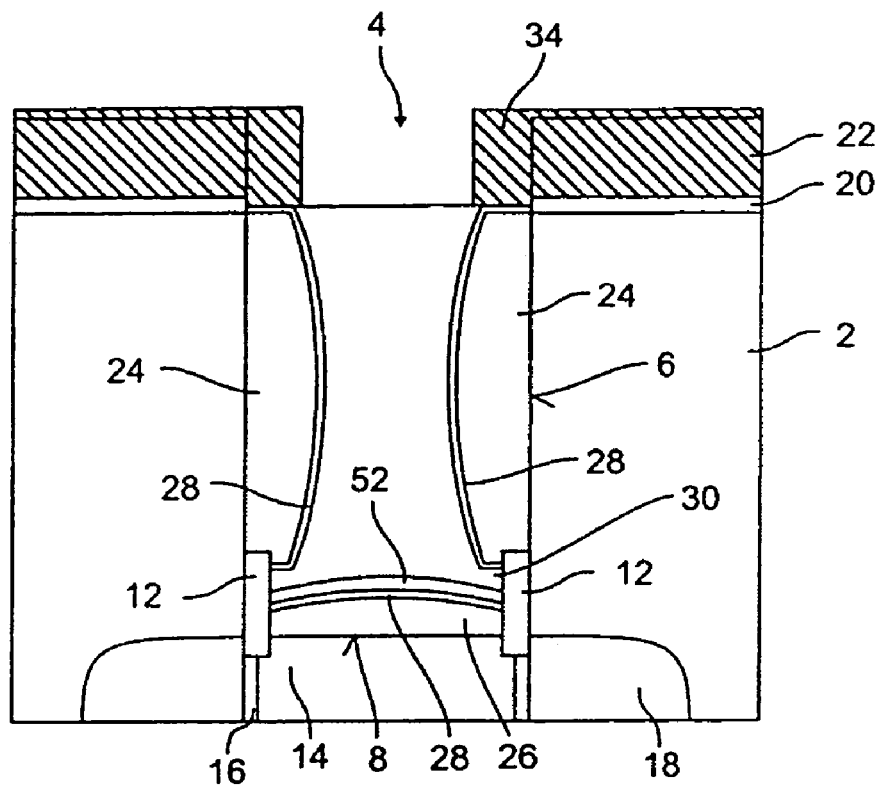
Figures 2, 3, 4, 5, 6, 7, 8:
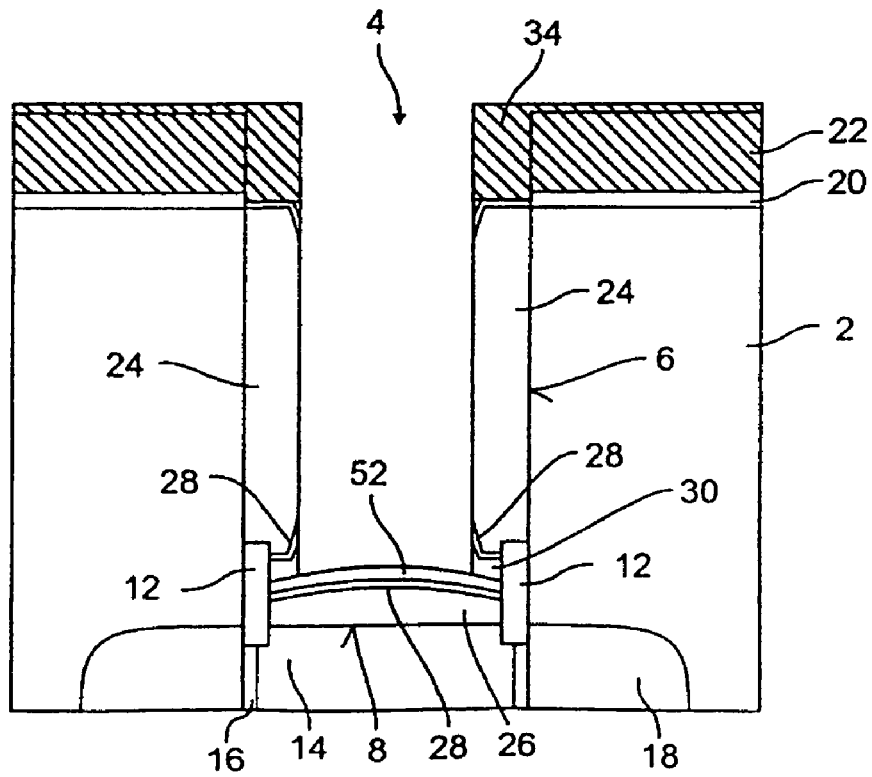
Figures 2, 3, 4, 5, 6, 7, 8, 9:
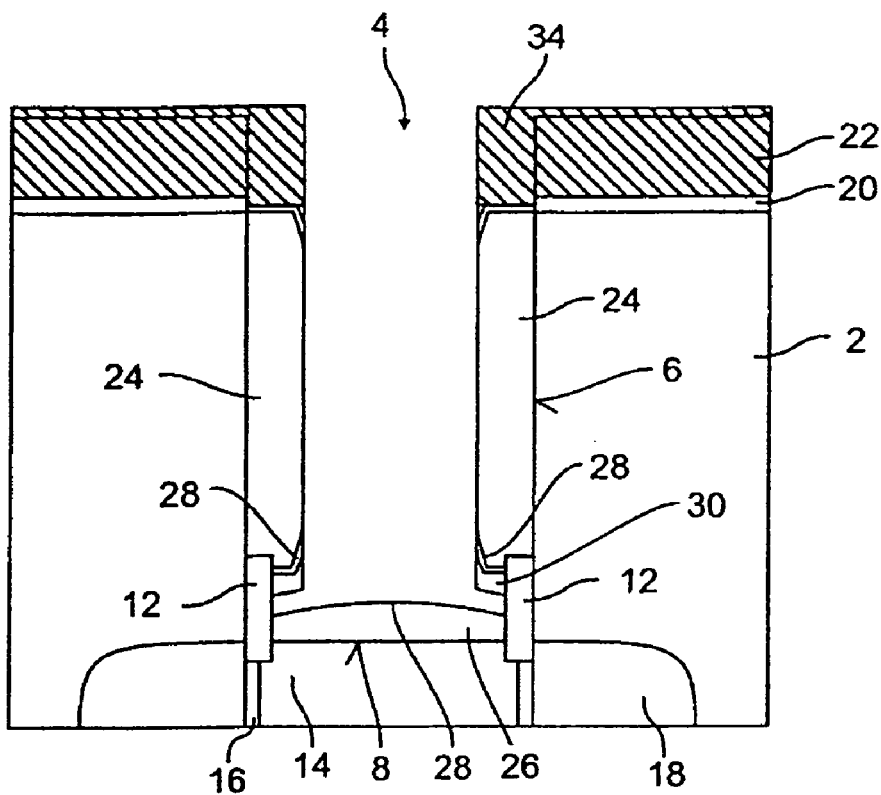
Figures 2, 3, 4, 5, 6, 7, 8, 9, 10:
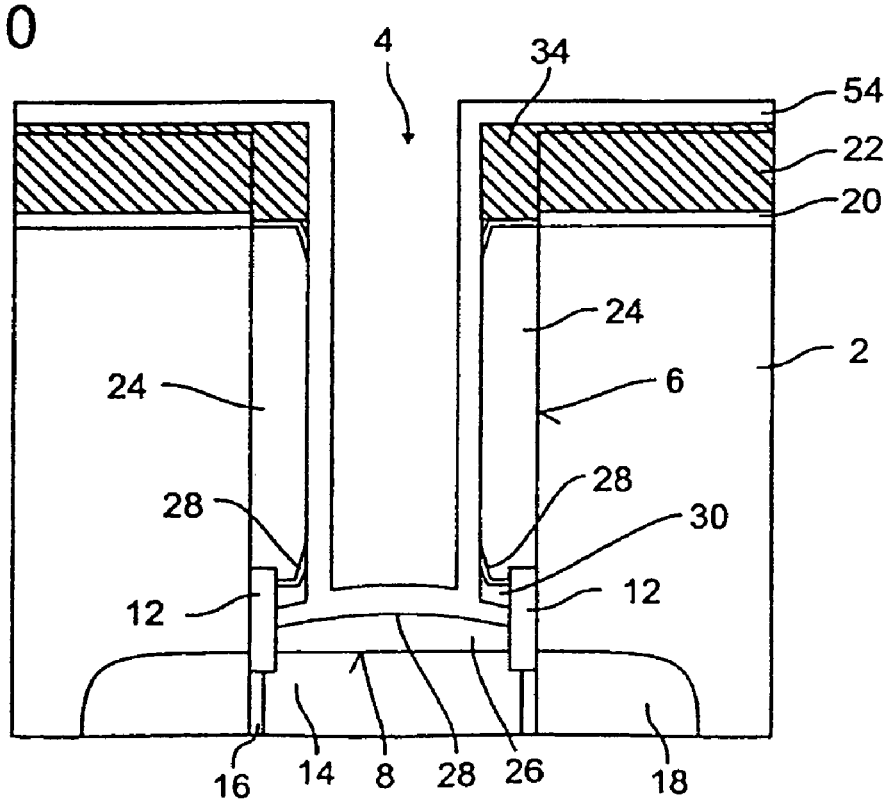
Figures 2, 3, 4, 5, 6, 7, 8, 9, 10, 11:
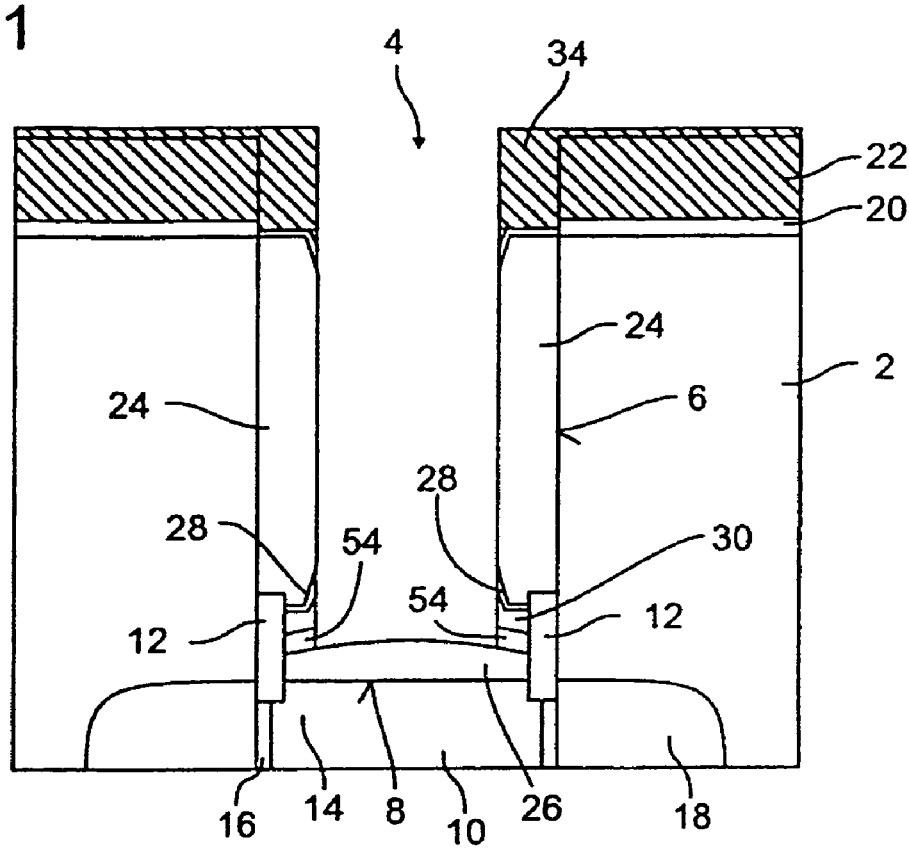
Figure 3:
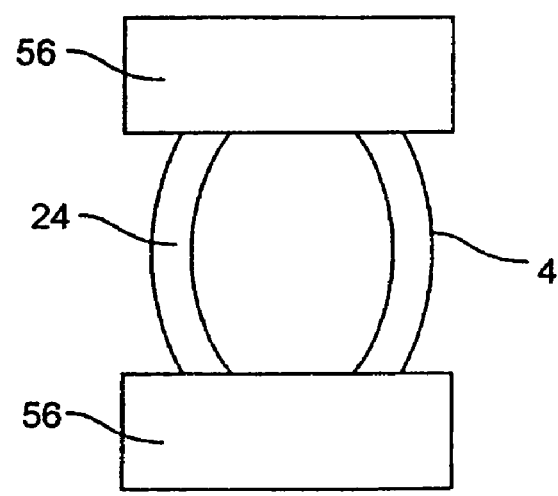

Then, semiconductor layers 24 and 26 grow onto the side wall 6 and base 8 which have been uncovered in this way and may also have been subjected to wet-chemical cleaning using dilute hydrofluoric acid. Because the substrate below it is in single-crystal form, the semiconductor layer 24 which is deposited on the side wall 6 grows epitaxially, i.e. in single crystal form, whereas the semiconductor layer 26, on account of the polycrystalline substrate below it, grows in polycrystalline form. Silicon is preferably selected as the deposition material. The procedure for deposition of the semiconductor layers 24 and 26 is selected in such a way that the semiconductor layer 24 can form as an epitaxial semiconductor layer 24. In particular, the deposition was carried out at a substrate temperature of 900° C. with a deposition rate of up to 60 nm/min. Furthermore, the deposition takes place selectively with respect to the material of the transition region 12 and the pad oxide 20 and the pad nitride 22. FIG. 1-2 shows the semiconductor layers 24 and 26 in an early state of their growth, whereas FIG. 1-3 shows the semiconductor layers 24 and 26 after the end of deposition. The thickness of the deposited semiconductor layers is selected in such a way that, firstly, the epitaxial semiconductor layer 24 is isolated from the semiconductor layer 26 by a space which has been left clear and, secondly, the mutually facing surfaces of the epitaxial semiconductor layer 24 are still spaced apart from one another by a sufficient distance for the further process not to be impeded. In the present exemplary embodiment, for a given minimum feature size F of 100 nm, the starting point is a diameter of the trench 4 of approximately 250 nm. The epitaxial semiconductor layer can then be formed with a thickness of approximately 90 nm, so that the uncovered cross section of the trench 4 is still approximately 70 nanometers. Within this framework, the thickness of the epitaxial semiconductor layer can be selected relatively freely in order to establish the desired channel cross section of the vertical transistor. The size of the space between epitaxial semiconductor layer 24 and polycrystalline semiconductor layer 26 is also determined by the extent of the transition region 12.

During deposition, optionally varying doping is possible, as a result of which, given the approximately circular trench cross section which is assumed in the present instance, concentric doping regions are formed.

Then, a thin dielectric 28 is formed on the deposited semiconductor layers 24 and 26 by thermal nitriding. The thin dielectric 28, which consists of silicon nitride, has a material thickness of only a few Å, for example 5 Å. Next, the trench 4, including the space between the epitaxial semiconductor layer 24 and the semiconductor layer 26, is filled with a conductive material 30, which in the case of the n-doped inner capacitor electrode 14 is likewise n-doped. In this case, highly doped polysilicon is once again a suitable material. The conductive material 30 is recessed down to approximately the upper edge of the epitaxial semiconductor layer 24 by means of an etching step. The structure obtained in this way is shown in FIG. 1-6.

As shown in FIGS. 1-7 and 1-8, approximately 25 nm thick edge webs 34 are formed by anisotropic etching from silicon nitride layer 32 which has previously been deposited over the entire surface. The edge webs 34 subsequently serve as an etching mask during an anisotropic RIE (reactive ion etching) step, during which the conductive material 30 is removed apart from an annular residue which continues to fill the space between the epitaxial semiconductor layer 24 and the semiconductor layer 26. Furthermore, the etching step uncovers part of the surface of the epitaxial layer 24. This is followed by the formation of an insulating layer 38 at the base of the trench 4 by anisotropic deposition and isotropic etching back of an oxide layer 36, e.g. a trench top oxide, by means of an HDP (High Density Plasma) process. These method steps can be seen from FIGS. 1-10 and 1-11. The insulating layer 38 which is formed at the base 8 of the trench 4 insulates the inner capacitor electrode 14 and the conductive material 30 which remains in the space from the gate electrode which is to be formed in the trench which is still open. Before this, however, a gate dielectric 40 is formed by thermal oxidation on the uncovered surface of the epitaxial semiconductor layer 24, and the trench 4 is then filled with highly doped n-polysilicon in order to form the gate electrode 42.

To complete the vertical transistor, an n-doping region 48 is formed in the upper region of the epitaxial semiconductor layer 24, for example by implantation, a connection 46 to an active word line AWL is produced and the doping region 48 (source region) is connected via the bit line BL. Furthermore, a heat treatment is used to create an outdiffusion region 44 (drain region) in the lower region of the epitaxial semiconductor layer 24. During this treatment, dopants diffuse out of the conductive material 30 located in the space, out of the semiconductor layer 26 and also out of the polycrystalline semiconductor material 10, through the thin dielectric 28, into the epitaxial semiconductor layer 24, where they form the n-doping region 44. The thin dielectric 28 limits the diffusion of the dopants, which as a result remain to a greater extent in the region of the epitaxial semiconductor layer 24. The insulation collar 12, which has a length of approximately 1 μm in the vertical direction, likewise contributes to limiting the lateral outdiffusion.

The outdiffusion in order to form the diffusion region 44 preferably takes place together with the oxidation of the side walls of isolation trenches STI, which are designed to isolate planar transistors or are formed between adjacent trenches. An isolation region STI of this type, also known as a shallow trench isolation, is shown, for example, in the plan view of a memory cell with vertical transistor which is illustrated in FIG. 3. The isolation regions STI cut off the sharp corners of the trenches, which are formed elliptically in cross section, so that the epitaxial semiconductor layer 24 is formed as two half-shells which lie opposite one another.

Although the thin dielectric 28 limits the flow of current from the inner capacitor electrode 14 via the conductive material 30 located in the space to the doping region 44, the resulting increase in the contact resistance is still acceptable if the dielectric 28 is designed to be correspondingly thin.

On the upper side of the semiconductor substrate 2, laterally with respect to the word line AWL, there are what are known as passing word lines PWL, which are insulated from the semiconductor substrate 2 by means of an insulation layer 50 and which make contact with gate electrodes belonging to other vertical transistors lying in the direction which is perpendicular to the plane of the drawing.

A further embodiment of the fabrication method according to the invention is to be explained below with reference to FIGS. 2-1 to 2-11. The first method steps correspond to those shown in FIGS. 1-1 to 1-4, and consequently the structure shown in FIG. 1-4 corresponds to that shown in FIG. 2-1. As a modification to the first exemplary embodiment, an insulating layer 52 in the form of a thin oxide film is then formed by a process which involves deposition primarily in the base region. This can be achieved, for example, by means of an HDP process. Then, the insulating layer 52 is isotropically etched back selectively with respect to silicon nitride, so that the insulating layer 52 remains at the base of the trench and the thin dielectric 28 is uncovered. This is followed, as shown in FIGS. 2-4 to 2-7, by the method steps which have already been shown with reference to FIGS. 1-5 to 1-8. Therefore, these steps are not explained in connection with the present embodiment. However, the subsequent anisotropic RIE step, which corresponds to the etching step shown in FIG. 1-9, stops at the insulating layer 52. In a similar manner to that shown in FIG. 1-9, the conductive material 30 is removed from the trench 4 apart from the space between the epitaxial semiconductor layer 24 and the semiconductor layer 26. At the same time, a surface of the epitaxial semiconductor layer 24 is uncovered by removing the thin dielectric 28 which lies at that location. The resulting structure can be seen in FIG. 2-8.

Next, the oxide layer 52 and the thin dielectric 28 resting on the semiconductor layer 26 are removed, so that a cavity is formed between the conductive material 30 and the semiconductor layer 26. This cavity can be filled with a further conductive material 54, for example comprising highly doped n-polysilicon or tungsten silicide, by deposition and anisotropic etching back. During the etching back, the edge webs 34 serve as an etching mask. The method steps shown in FIGS. 1-10 to 1-14 then follow. The entire space between epitaxial semiconductor layer 24 and semiconductor layer 26 is therefore filled by two layers of conductive material. The freedom of choice with regard to the selection of materials is in this case very high.

In the embodiment shown here, the thin dielectric 28 remains only on the epitaxial semiconductor layer 24. However, this is sufficient to delimit the epitaxial semiconductor layer with resect to the polycrystalline conductive material 30. Moreover, the contact resistance between the epitaxial semiconductor layer 24 and the inner capacitor electrode 14 is limited by one layer of the thin dielectric 28.

LIST OF REFERENCE SYMBOLS

2 Semiconductor substrate in single crystal form
4 Trench
6 Side wall
8 Base
10 Polycrystalline semiconductor material
12 Insulation collar/transition region
14 Inner capacitor electrode
16 Storage dielectric
18 Outer capacitor electrode
20 Pad oxide
22 Pad nitride
24 Epitaxial semiconductor layer
26 Semiconductor layer
28 Thin dielectric
30 Conductive material
32 Silicon nitride layer
34 Edge webs/etching mask
36 Oxide layer
38 Insulating layer
40 Gate dielectric
42 Gate electrode
44 Doping region/drain region
46 Connection
48 Doping region/source region
50 Insulation layer
52 Insulating layer
54 Further conductive material
AWL Word line
PWL Passing word line
STI Isolation trench

What is claimed is:

1. A method for fabricating a vertical transistor in a trench, comprising:
    providing a trench,
        having a base and at least one side wall which consists, at least in certain regions, of a semiconductor material, and
        a transition region comprising an insulating material between the regions of the base and the side wall which consist of semiconductor material;
    selectively depositing semiconductor material on the regions of the side wall and the base of the trench which consist of semiconductor material, to form semiconductor layers, during which
        at least the semiconductor layer which is deposited on the side wall grows as an epitaxial semiconductor layer, and
    a space remains between the semiconductor layers which have been deposited on the base and the side wall;

forming a thin dielectric, which partially limits an electric current, on at least one of the semiconductor layers which have been deposited;

filling the space between the two semiconductor layers which have been deposited with a conductive material; and forming a gate dielectric and a gate electrode on the epitaxial semiconductor layer which has grown.

2. The method as claimed in claim 1, wherein the thin dielectric is substantially limited to 2–3 monolayers.

3. The method as claimed in claim 1, the thin dielectric is formed with a thickness of approximately 5 Å.

4. The method as claimed in claim 1, wherein the thin dielectric consists of silicon nitride and the deposited semiconductor layers consist of silicon, and the thin dielectric is produced by thermal nitriding of at least one of the semiconductor layers.

5. The method as claimed in claim 1, wherein the semiconductor material which has been deposited on the base of the trench forms a polycrystalline semiconductor layer.

6. The method as claimed in claim 1, wherein
the thin dielectric is formed on the deposited semiconductor layers, and
before the space is filled with the conductive material, an insulating layer is deposited using a predominantly anisotropic deposition process and is then etched isotropically, so that the insulating layer is removed from vertical surfaces and substantially remains at the base of the trench.

7. The method as claimed in claim 6, wherein
the isotropic etching stops at the insulating layer which has remained at the base of the trench,
the insulating layer and the thin dielectric are removed from the base of the trench, and
a cavity which has formed between the conductive material and the semiconductor layer which has been deposited at the base of the trench is filled with a further conductive material.

8. The method as claimed in claim 7, wherein the further conductive material is highly doped polysilicon or tungsten silicide.

9. The method as claimed in claim 1, wherein
to fill the space with the conductive material, the trench is substantially filled with the conductive material,
a mask is formed in a region of the trench opening, above the epitaxial semiconductor layer which has been applied to the side wall,
an anisotropic etch is carried out using the mask, during which etch the conductive material is removed from the trench down as far as the space and a surface of the epitaxial semiconductor layer which faces toward the interior of the trench is uncovered, and
the gate dielectric is formed on the uncovered surface of the epitaxial semiconductor layer.

10. The method as claimed in claim 1, wherein
the conductive material and the semiconductor material, which forms the base of the trench at least in certain regions, are in each case a doped polycrystalline semiconductor material of a first conductivity type;
the semiconductor material which forms at least one side wall at least in certain regions is a semiconductor material of a second conductivity type in single-crystal form; and
the deposited semiconductor layers each have the same conductivity type as the substrate to which they have been applied.

11. The method as claimed in claim 10, wherein a heat treatment is carried out, during which dopants diffuse out of the conductive material into the epitaxial semiconductor layer through the thin dielectric which has been formed on the epitaxial semiconductor layer and in the epitaxial semiconductor layer produce a doping region of the first conductivity type.

12. The method as claimed in claim 1, wherein the trench is an upper part of a capacitor trench, and the semiconductor material located at the base of the trench is formed by the polycrystalline semiconductor material of an inner capacitor electrode of the capacitor.

13. The method as claimed in claim 12, wherein the transition region is formed from the insulating material of an insulation collar of the capacitor trench.

14. The method as claimed in claim 1, wherein the trench has a cross section whose extent is greater than the minimum feature size which can be achieved by lithography.

15. The method as claimed in claim 1, wherein the epitaxial semiconductor layer is doped in situ during its deposition.

16. A method for fabricating a vertical transistor in a trench, comprising:
forming a trench in a single-crystal semiconductor material of a second conductivity type, which apart from its upper part is lined with a dielectric and which is filled with a doped polycrystalline semiconductor material of a first conductivity type, so that an upper partial trench remains, extending above the polycrystalline semiconductor material, a transition region comprising insulating material, which runs approximately in a shape of a ring at a base of the partial trench, being arranged between the polycrystalline semiconductor material located at the base of the partial trench and the single-crystal semiconductor material which forms side walls of the partial trench;

selectively depositing semiconductor material on the side wall and the base of the partial trench, to form semiconductor layers, during which
the semiconductor layer which has been deposited on the side wall grows as an epitaxial semiconductor layer, and
the semiconductor layer which has been deposited on the base grows as a polycrystalline semiconductor layer, and
a space remains between the two semiconductor layers which have been deposited;

forming a thin dielectric, which partially limits an electric current, on the epitaxial semiconductor layer;

filling the space between the two semiconductor layers which have been deposited with a doped polycrystalline semiconductor material of the first conductivity type;

forming a gate dielectric and a gate electrode on the epitaxial semiconductor layer; and carrying out a heat treatment, as a result of which dopants of the first conductivity type diffuse out of the polycrystalline semiconductor material which has been deposited, through the thin dielectric, into the epitaxial semiconductor layer where they form a doping region of the first conductivity type.

* * * * *